United States Patent
Anderson et al.

(10) Patent No.: US 7,203,213 B2
(45) Date of Patent: Apr. 10, 2007

(54) LASER TURN-ON ACCELERATOR INDEPENDENT OF BIAS CONTROL LOOP BANDWIDTH

(75) Inventors: Douglas P. Anderson, Nevada, IA (US); Peter Chambers, Phoenix, AZ (US); Joseph J. Judkins, III, Austin, TX (US); William Andrew Burkland, Huxley, IA (US)

(73) Assignee: Micrel, Incorporated, San Jose, CA (US)

( * ) Notice: Subject to any disclaimer, the term of this patent is extended or adjusted under 35 U.S.C. 154(b) by 316 days.

(21) Appl. No.: 10/759,987

(22) Filed: Jan. 15, 2004

(65) Prior Publication Data

US 2005/0129075 A1 Jun. 16, 2005

Related U.S. Application Data

(60) Provisional application No. 60/530,040, filed on Dec. 15, 2003.

(51) Int. Cl.
*H01S 3/00* (2006.01)
(52) U.S. Cl. ............... 372/38.07; 372/29.015; 372/38.02
(58) Field of Classification Search ........... 372/29.015, 372/38.07
See application file for complete search history.

(56) References Cited

U.S. PATENT DOCUMENTS

| | | | |
|---|---|---|---|
| 6,115,398 A | 9/2000 | Jiang | |
| 6,466,595 B2 | 10/2002 | Asano | |
| 6,496,525 B1 * | 12/2002 | Kimura | 372/38.02 |
| 6,597,485 B1 | 7/2003 | Ikeuchi et al. | |
| 2002/0114363 A1 | 8/2002 | Everett | |

\* cited by examiner

*Primary Examiner*—Minsun Oh Harvey
*Assistant Examiner*—Tod T. Van Roy
(74) *Attorney, Agent, or Firm*—Patent Law Group LLP; Carmen C. Cook (57) ABSTRACT

An accelerator circuit is incorporated in a laser diode system for accelerating the turn-on operation of the laser diode independent of the control loop bandwidth of the laser diode system. The accelerator circuit provides a boost current to a compensation capacitor upon laser turn-on which compensation capacitor operates to establish the control loop bandwidth of the laser diode system. The boost current enables the control loop to increase the bias current to the laser diode quickly. When the laser diode reaches the desired operating point, the boost current is terminated and the control loop of the laser diode system resumes normal control of the bias current. In one embodiment, the accelerator circuit includes a timer circuit controlling a current source to implement open loop turn-on control. In another embodiment, the accelerator circuit includes a comparator circuit working in conjunction with an one-shot logic circuit for providing close loop control.

19 Claims, 8 Drawing Sheets

LASER TURN-ON ACCELERATOR INDEPENDENT OF BIAS CONTROL LOOP BANDWIDTH

CROSS-REFERENCE TO RELATED APPLICATION

This application claims the benefit of U.S. Provisional Patent Application Ser. No. 60/530,040, filed on Dec. 15, 2003, having the same title and inventorship hereof, which application is incorporated herein by reference in its entirety.

FIELD OF THE INVENTION

The invention relates to laser bias control and, in particular, to a device and method for accelerating the turn on of a laser independent of the bias control loop bandwidth.

DESCRIPTION OF THE RELATED ART

Optical communication systems commonly employ semiconductor lasers or other optical emitters for transmitting signals indicative of a low value and a high value. The semiconductor laser or optical emitter may be formed as a fiber optics transmitter and an optical transceiver. Semiconductor lasers, such as edge emitting lasers and vertical cavity surface emitting lasers, are well known.

A semiconductor laser, also called a laser diode, requires a bias current above a threshold level applied to the laser to turn the laser on so that lasing can occur. Once the laser is turned on, the laser can transmit data signals (high/low values) by receiving a modulation current which operates to modify the optical power emitted by the laser diode. The two levels of the data pattern are usually represented by a large emitted optical power or a small emitted optical power.

In certain situations, the laser diode may be turned off or become turned off. That is, the bias current applied to the laser diode drops below the threshold level or is discontinued completely. To restart the laser operation, the bias current must be ramped up to exceed the threshold level so that the diode enters a stable operation point where lasing can occur.

Laser bias must be adjusted over time to compensate for variations in the average output power level due to laser aging, temperature variations, and other factors. A command signal is usually provided to the laser diode to change the level of the bias current so as to maintain the desired average output power level. However, once a specific bias current value is selected, it is often desirable that the laser bias current be maintained at a constant level and not drift from the selected value over time. In this manner, the laser output power level is also maintained at the desired level. An automatic power control (APC) circuit, a simple servo loop, is typically used to maintain the bias current at a constant value. The optimal bandwidth of this control loop is dictated by several factors including the required laser turn-on and/or turn-off times, the data rate, and the data format.

If the control loop bandwidth of the APC control loop is too wide, i.e., the loop responds quickly, it may track variations in output power caused by the data pattern. This introduces pattern-dependent jitter into the bias current control and is to be avoided. Typically, a narrow APC control loop bandwidth, i.e., a loop that responds slowly, is desired so that the bias current value is adjusted in a manner to maintain the desired average output power level.

Industry standards, e.g., the Small Formfactor Pluggable Multisource Agreement (SFP MSA), may dictate that the laser must be turned on within a given time period following the assertion of certain enable commands. A narrow loop bandwidth may not be able to meet the turn-on requirement. However, a loop fast enough to meet the turn-on time requirements may track the data pattern and introduce jitter. Therefore, it is desirable to provide a means to enable a fast laser turn-on while maintaining a narrow bias loop bandwidth to prevent tracking of the data pattern.

SUMMARY OF THE INVENTION

According to the embodiments of the present invention, a laser turn-on accelerator circuit is incorporated in a laser diode system for accelerating the turn-on operation of the laser diode. The laser turn-on accelerator circuit operates only when the laser is to be turned on to accelerate the turn-on operation while allowing the laser diode system to maintain a narrow control loop bandwidth once the laser diode is turned on.

In one embodiment of the present invention, an accelerator circuit for accelerating the turn-on operation of a laser diode is disclosed. The laser diode is connected to a current driver circuit providing a bias current to the laser diode. A control circuit is connected to the current driver circuit for controlling the bias current in response to a command signal indicative of the desired bias current level and the commanded power of the laser diode and a feedback signal indicative of the laser output power level. The control circuit includes a compensation capacitor establishing the control loop bandwidth of the control circuit. The accelerator circuit includes a timer circuit coupled to receive a first signal for turning on the laser diode. The timer provides a control signal having a first state for a preselected time duration when the first signal is received and having a second state at the expiration of the preselected time duration. The accelerator circuit further includes a current source, responsive to the control signal, for providing a boost current to the compensation capacitor of the control circuit. In operation, the timer circuit provides the control signal having the first state for turning on the current source. Furthermore, the timer circuit provides the control signal having the second state for turning off the current source. In this manner, an open loop turn-on acceleration control is provided.

According to another embodiment of the present invention, an accelerator circuit for accelerating the turn-on operation of a laser diode using a close loop control is disclosed. The accelerator circuit includes a comparator coupled to receive the command signal and the feedback signal where the comparator provides a first output signal having a first state when the feedback signal indicates that the laser diode has not reached the commanded power and having a second state when the feedback signal indicates that the laser diode has reached or exceeded the commanded power. The accelerator circuit also includes a first logic circuit coupled to receive the first output signal and a first signal having a first state to turn on the laser diode and a second state to turn off the laser diode. The first logic circuit generates a control signal responsive to the first output signal and the first signal. Finally, the accelerator circuit includes a current source, responsive to the control signal, for providing a boost current to the compensation capacitor of the control circuit. In operation, the first logic circuit provides the control signal having a first state operating to turn on the current source when the first output signal and the first signal are in their respective first state. The first logic circuit provides the control signal having a second state operating to turn off the current source when either the first output signal or the first signal is in its respective second state. The first logic circuit operates to assert the control signal to the first state only once for each assertion of the first signal.

The present invention is better understood upon consideration of the detailed description below and the accompanying drawings.

DETAILED DESCRIPTION OF THE PREFERRED EMBODIMENTS

In accordance with the principles of the present invention, a laser turn-on accelerator circuit is coupled to the bias control loop of a laser diode system for accelerating the turn-on speed of the laser diode independent of the control loop bandwidth. In one embodiment, the laser diode system implements automatic power control (APC) using a differential amplifier including a compensation capacitor whose capacitance establishes the bandwidth of the control loop. The laser turn-on accelerator circuit provides a current boost to the compensation capacitor at the turn-on of the laser diode so that the laser diode can reach the desired stable operating point at a very fast speed. Once the laser is properly turned on, the turn-on accelerator circuit is disabled so that a narrow control loop bandwidth is maintained for stable APC of the laser bias current. In this manner, the turn-on accelerator circuit permits fast laser turn-on while maintaining a narrow bandwidth of the APC control loop to permit optimal performance during steady-state operation.

In one embodiment, the turn-on accelerator circuit operates in close loop control to prevent bias current overshoot so that the bias current will not increase beyond the desired steady-state operating point. Excess bias current is undesirable as it could cause damage to the laser diode and result in an unsafe level of radiation.

Figure 1:
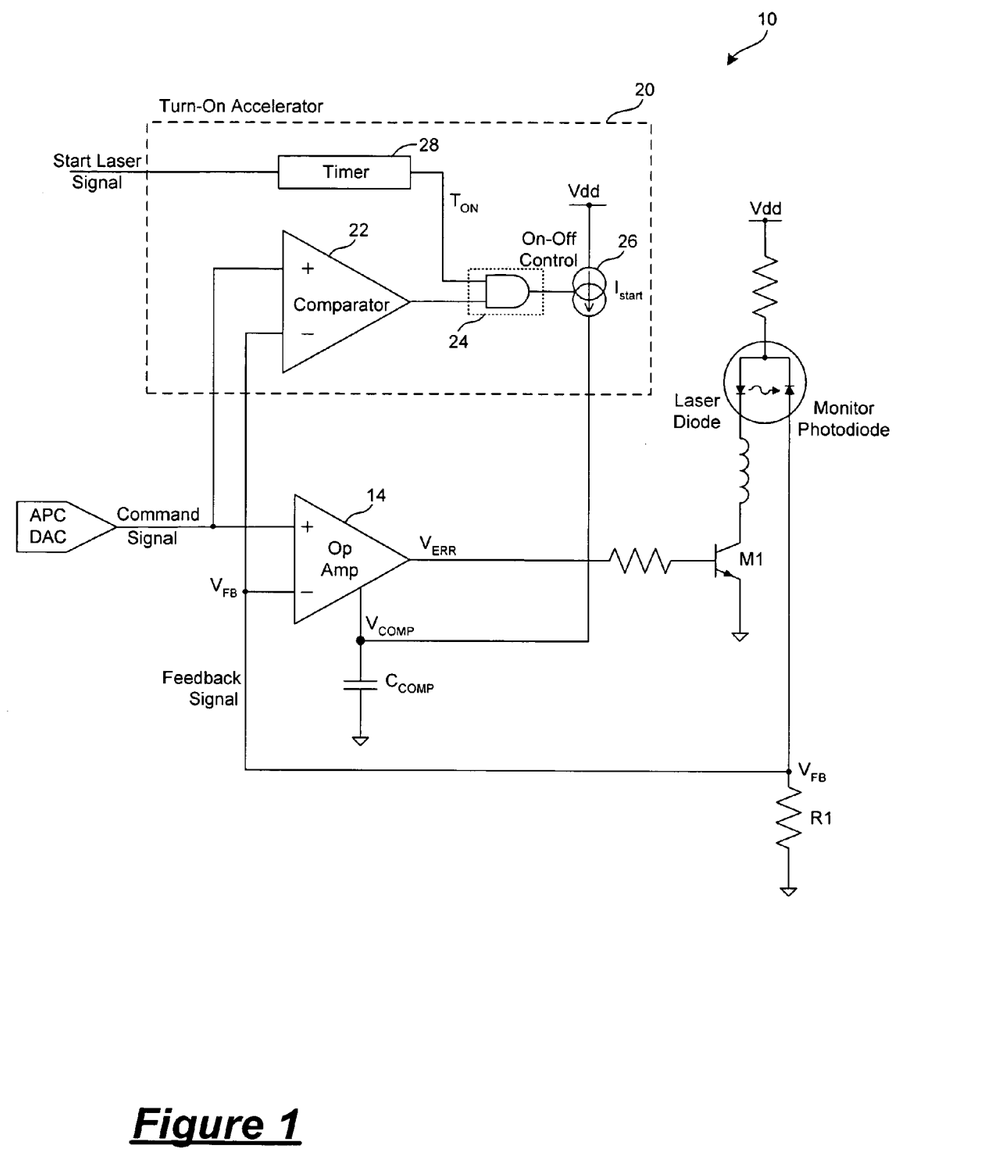
FIG. 1 is a schematic diagram of a laser diode system according to one embodiment of the present invention.

FIG. 1 is a schematic diagram of a laser diode system according to one embodiment of the present invention. FIG. 1 is a simplified circuit diagram of the laser diode system and illustrates only the laser driver circuit for driving the laser diode, including the automatic power control (APC) portion of the laser diode system. FIG. 1 illustrates the incorporation of the laser turn-on accelerator circuit of the present invention in the APC control loop of the laser diode system according to one embodiment of the present invention. The laser diode system may include other components not shown in FIG. 1 but well known in the art to facilitate the data transmission operation of the laser diode system. For example, the laser diode system typically includes a modulation circuit coupled to the laser diode to provide a source of modulation current. The modulation current modulates the output power of the laser diode in accordance with the data signals to be transmitted by the laser diode.

Referring to FIG. 1, laser diode system 10 includes a laser diode for transmitting signals in the form of a low value and a high value. A bias current above a threshold level is provided to the laser diode to turn-on the laser diode and bias the laser diode to a stable operating point. As described above, the bias current to the laser diode is selected so as to provide a desired average output power for the laser diode. An APC control loop is used to maintain the value of bias current, and hence the average output power, at the preselected level. In general, adjustment of the output power is achieved by establishing a feedback loop whereby the emitted output power is measured and the laser bias current is adjusted to maintain a constant laser emission power.

More specifically, the APC control loop in laser diode system 10 is established as follows. A monitor photodiode is placed in the vicinity of the laser diode to measure a portion of the optical power output generated by the laser diode. Usually, the monitor photodiode is placed behind the laser diode to measure the backward emission of the laser diode. A current indicative of the laser output power is generated at the monitor photodiode which current is converted to a feedback voltage $V_{FB}$ at resistor R1. The feedback voltage is coupled to the negative input terminal of an operational amplifier 14. The positive input terminal of operational amplifier 14 is coupled to receive a command signal which is indicative of the selected bias current level. Typically, the command signal is provided by a digital-to-analog converter of the APC loop (APC DAC). The APC DAC receives control signals from other control circuit (not shown) of the laser diode system for determining the desired bias current level as a function of temperature, aging and other factors affecting the output power of the laser diode.

Operational amplifier 14 operates as a differential amplifier and measures the difference between the command signal and the feedback signal. Operational amplifier 14 provides an error output signal $V_{ERR}$ indicative of the difference between the command signal and the feedback signal. The error output signal $V_{ERR}$ is coupled through a resistor to drive the base terminal of an NPN bipolar transistor M1 so as to bias the laser diode at the desired bias current level. Basically, the APC loop operates to keep the error between the feedback signal and the command signal at zero or near zero. That is, the feedback signal is compared to the command signal at operational amplifier 14 and when the two values are equal, the desired bias current level is reached and the control loop is at the desired operating point.

Typically, an APC control loop employs one or more compensation capacitors, sometimes in combination with one or more resistors, to adjust the bandwidth of the control loop. The capacitance and resistance values are chosen to optimize the performance of the laser diode system in a given application. The total capacitance value of the compensation capacitors has to be sufficiently large to keep the control loop stable but not too large so as to make the loop response very slow, resulting in an extended laser turn-on time.

In FIG. 1, the APC control loop includes a compensation capacitor $C_{COMP}$ coupled to operational amplifier 14. The compensation capacitor is coupled to a node in the operational amplifier and the Vss node. The capacitance value of the compensation capacitor establishes the bandwidth of the APC control loop. In operation, the compensation capacitor is charged or discharged by a current generated by operational amplifier 14 in order to move the operating point of the control loop. A large capacitance value results in a narrow bandwidth and thus a slower loop response as the capacitor will take longer time to charge or discharge with a given current. A narrow loop bandwidth is often needed to prevent the control loop from tracking the variations in the output power caused by the data pattern, such as long chains of one's and zero's. However, a narrow loop bandwidth also results in a slow laser turn-on time.

When the laser diode is turned off, that is, when the bias current has been reduced to below the threshold level or to zero, and is to be turned back on, a narrow control loop bandwidth means that a long turn-on time is required. A long turn-on time may not be acceptable in some applications and in some cases may violate requirements of industrial standards. Increasing the loop bandwidth to accommodate a faster laser turn-on requirement is not practical as the stability and effectiveness of the control loop can be severely compromised.

In accordance with the present invention, a laser turn-on accelerator circuit 20 is incorporated in laser diode system 10 for accelerating the turn-on of the laser diode independent of the established loop bandwidth of the APC control loop of the laser diode system. Turn-on accelerator circuit 20 includes a current source 26 providing a source of boost current $I_{start}$ for charging compensation capacitor $C_{COMP}$ when the laser diode is to be turned on. In the present embodiment, current source 26 provides a source of DC current. Current source 26 receives an on-off control signal which operates to turn the current source on to provide boost current $I_{start}$ to capacitor $C_{COMP}$ or turn the current source off to terminate the boost current. The on-off control signal is activated when the laser diode is to be turned on and usually persists for a sufficient duration to accelerate the turn-on operation of the laser diode. When the laser diode is turned on, the on-off control signal is deactivated to terminate the boost current $I_{start}$ and permit the APC loop to operate to regulate the bias current.

In the present embodiment the on-off control signal is generated as follows. Turn-on accelerator 20 includes a timer 28 coupled to receive a "stan laser signal" as an input signal. In most systems, the host computer sends a start laser signal to the laser diode system to turn the laser diode on when the laser diode has been turned off. The start laser signal can also be a power-on-reset signal. For example, the host system may experience a fault which may cause the laser diode to be turned-off. When the host computer clears the fault, the host computer will issue a start laser signal to turn the laser diode back on. In the present embodiment, the start laser signal represents any signal that is issued to laser diode system 10 instructing the laser diode system to turn on the laser diode. Timer 28 is triggered by the start laser signal and asserts a time-on signal $T_{on}$ at its output terminal. Timer 28 provides a preselected time duration before deasserting the time-on signal $T_{on}$. The time-on signal $T_{on}$ is coupled to one input of a logic circuit 24. In the present embodiment timer 28 is a counter which, upon being triggered by the start laser signal, will count down for the preselected time duration.

In addition to timer 28, turn-on accelerator circuit 20 includes a comparator 22 for establishing closed loop control of the laser turn-on operation. Comparator 22 is coupled to receive the command signal, indicative of the desired bias current level and therefore the desired output power, and the feedback signal, indicative of the current output power level. In the present embodiment, the command signal is coupled to the positive input terminal and the feedback signal is coupled to the negative input terminal of comparator 22. The output signal from comparator 22 is coupled to the second input terminal of logic circuit 24. Comparator 22 compares the feedback signal and the command signal. When the feedback signal $V_{FB}$ indicates that the laser diode has not reached the commanded power, comparator 22 generates an output signal having a first state for causing current source 26 to turn on to provide the boost current to the compensation capacitor. When the feedback signal $V_{FB}$ indicates that the laser diode has reached or exceeded the commanded power, that is, the laser diode has reached its desired operating point and is deemed turned on, comparator 22 generates an output signal having a second state for causing current source 26 to turn off.

In the present configuration, the feedback signal $V_{FB}$ has a value that is less than the command signal to indicate that the laser diode has not reached the commanded power and the feedback signal $V_{FB}$ has a value that is equal to or greater than the command signal to indicate that the laser diode has reached or exceeded the commanded power.

In the present description, the terms "commanded power" or "commanded power level" refer to the desired power level of the laser diode as determined by the value of the command signal. The commanded power of the laser diode can be the full power capability of the laser diode or it can be less than the full power capability of the laser diode.

Logic circuit 24 receives the time-on signal $T_{on}$ from timer 28 and the output signal from comparator 22 and generates an on-off control signal accordingly. That is, when the time-on signal $T_{on}$ is asserted and the comparator signal is in the first state (such as a logical high state), the on-off control signal of logic circuit 24 is asserted to turn on current source 26. On the other hand, when either the time-on signal $T_{on}$ is deasserted or the comparator signal is in the second state (such as a logical low state), the on-off control signal of logic circuit 24 is deasserted to turn off current source 26.

In the present embodiment, logic circuit 24 is an AND gate as shown in FIG. 1. In an alternate embodiment, logic circuit 24 is implemented as an one-shot logic circuit whereby logic circuit 24 enables current source 26 only once for each assertion of the start laser signal. Implementing logic circuit 24 as an one-shot logic circuit has the advantage of preventing the ringing of the on-off control signal in the event that the feedback signal $V_{FB}$ drifts about the command signal when the time-on signal $T_{on}$ is asserted. Specifically, when the time-on signal $T_{on}$ is asserted, once comparator 22 detects that the feedback signal $V_{FB}$ has reached the value of the command signal, the one-shot logic circuit will deassert the on-off control to turn off current source 26. Subsequently, while the time-on signal $T_{on}$ remains asserted but regardless of the state of the comparator output, the one-shot logic circuit prevents the on-off control signal to be asserted again. In this manner, the one-shot logic circuit permits current source 26 to be turned on only once for each assertion of the start laser signal. The one-shot logic circuit is reactivated at the next start laser signal to permit current source 26 to turn on again for accelerating the turn-on operation of the laser diode. In one embodiment, logic circuit 24 implemented as an one-shot logic circuit receives the start laser signal as an input signal in addition to the time-on signal $T_{on}$ and the comparator output signal.

By using the close loop control operation provided by comparator 22, turn-on accelerator circuit 20 is able to use boost current $I_{start}$ to bring the feedback signal very close to the command signal when the laser is to be turned on. In some situations, there may be a small amount of bias overshoot because of the propagation delay through the comparator circuit which allows a small amount of extra charge to be placed on the compensation capacitor. The overshoot condition can be addressed by introducing systematic offset into comparator 22.

The operation of laser turn-on accelerator circuit 20 of FIG. 1 is as follows. When the laser diode is turned off and is to be turned on, the host computer system will issue a start laser signal which is coupled to timer 28. Timer 28 is triggered by the start laser signal and asserts the time-on signal $T_{on}$ at its output terminal for a preselected time duration. That is, timer 28, upon being triggered by the start laser signal, counts down for the preselected time duration before deasserting the time-on signal $T_{on}$. In the present embodiment, when time-on signal $T_{on}$ is asserted, the time-on signal $T_{on}$ has a logical high value, which together with the signal output from comparator 22, enables AND gate 24 to turn on current source 26.

When the host system issues the start laser signal, the APC DAC also provides the command signal to the APC loop instructing the control loop to bring up the bias current of the laser diode to the preselected level. Because the laser diode has been turned off, the bias current to the laser diode has decreased to below the threshold level. The feedback signal $V_{FB}$ indicates that the laser diode has not reached the commanded power. In the present configuration, the feedback signal $V_{FB}$ monitoring the actual output power of the laser diode is much less than the command signal indicating the desired power level. Operational amplifier 14 operates to ramp up the error voltage $V_{ERR}$ and the corresponding current driving bipolar transistor M1 to increase the bias current provided to the laser diode.

At the same time, the command signal and the feedback signal are provided to comparator 22 of turn-on accelerator circuit 20. In the present embodiment, comparator 22 detects that the feedback signal $V_{FB}$ is less than the command signal (that is, the commanded power level is not reached) and asserts its output signal to a logical high state. Thus, when the laser diode is to be turned on, both the time-on signal $T_{on}$ and the output signal of comparator 22 have a logical high state to cause AND gate 24 to generate at its output terminal a logical high value as the on-off control signal. In the present embodiment, when the on-off control signal has a logical high value, current source 26 is turned on to provide a source of boost current $I_{start}$ to charge compensation capacitor $C_{COMP}$.

By introducing the additional source of current $I_{start}$ to compensation capacitor $C_{COMP}$, the voltage at the compensation capacitor can increase faster than what would be provided by the APC loop alone. Thus, the current increase at bipolar transistor M1 is accelerated and the bias current for the laser diode is ramped up quickly to bring the laser diode into the desired operating point. Because the APC control loop has to have a narrow bandwidth, the loop response is slow and the laser turn-on time would be very long if the APC control loop is the only circuit used for the turn-on operation. However, in accordance with the present embodiment, turn-on accelerator 20 aids in the turn-on operation to shorten the time required to bring up the laser bias current to the desired operating point.

In the embodiment shown in FIG. 1, a close loop control is provided to monitor the turn-on operation. That is, turn-on accelerator 20 monitors the progress of the turn-on operation and terminates the boost current as soon as the stable operating point is reached. In this manner, optimal turn-on acceleration can be achieved without overcharging compensation capacitor $C_{COMP}$ to cause undesirable or dangerous operating conditions or undercharging compensation capacitor $C_{COMP}$ to cause ineffective turn-on acceleration. Of course, the predetermined time duration set by timer 28 should be long enough to allow comparator 22 to implement close loop control.

In the present embodiment, the turn-on acceleration is terminated in two ways. The turn-on accelerator circuit is enabled only at laser turn-on and is disabled once the laser reaches the desired stable operating point or after a preselected time duration. Subsequent to laser turn-on, the APC loop takes over the control of maintaining the bias current level of the laser diode and the turn-on accelerator circuit is deactivated so that it does not interfere with the normal operation of the APC loop.

First, comparator 22 provides a close loop control for terminating the boost current $I_{start}$. Comparator 22 monitors the difference between the feedback signal and the command signal. When the feedback signal is equal to or greater than the command signal in the present embodiment, the bias current has been ramped up to the desired operating point and the feedback signal $V_{FB}$ indicates that the laser diode has reached or exceeded the commanded power. Comparator 22 then deasserts its output terminal and provides a logical low value as the comparator output signal. The "logical low" output signal from comparator 22 alone causes AND gate 24 to deassert the on-off control signal. In this manner, current source 26 is turned off and current $I_{start}$ is terminated. By using a close loop control in the turn-on acceleration, voltage overshoot at the compensation capacitor $C_{COMP}$ is prevented so that the driving circuit is protected from applying bias beyond the desired steady-state operating point. As mentioned above, excess bias current can cause damage to the laser or result in an unsafe level of radiation.

Second, in turn-on accelerator circuit 20, timer 28 sets then maximum amount of time that boost current $I_{start}$ can be applied to compensation capacitor $C_{COMP}$. Thus, when timer 28 is triggered by the start laser signal, timer 28 asserts the time-on signal $T_{on}$ for the preselected amount of time duration and then deasserts the time-on signal $T_{on}$ at the expiration of the preselected time duration. When time-on signal $T_{on}$ is deasserted, the signal goes to a logical low value. The "logical low" signal from timer 28 alone causes AND gate 24 to deassert the on-off control signal. In this manner, current source 26 is turned off and current $I_{start}$ is terminated. Thus, regardless of the error value from comparator 22, current source 26 is turned off at the predetermined time duration which sets the maximum allowable time for the application of the boost current. Specifically, timer 28 operates to allow turn-on accelerator circuit 20 to operate only at laser turn-on and disable the circuit entirely until the next turn-on operation. The accelerator circuit is deactivated until the next turn-on operation where a new start laser signal will trigger timer 28 to allow the current source 26 to be turned on. Timer 28 also operates as a safety switch to shut off the boost current after the maximum allowable time regardless of the laser condition so that undesirable or dangerous operating conditions are prevented.

By using a combination of comparator 22 and timer 28, turn-on accelerator circuit 20 operates to accelerate the turn-on operation of the laser diode system. However, after the laser diode reaches its desired stable operating point, the turn-on accelerator circuit is disabled by the operation of the close loop control and/or at the expiration of a preselected maximum time duration. In this manner, turn-on accelerator circuit 20 provides turn-on acceleration but does not interfere with the normal APC control and operation of the laser diode system.

As described above, in the embodiment shown in FIG. 1, logic circuit 24 is implemented as an AND gate. In this configuration, it is possible for current source 26 to be toggled on and off during the assertion of the time-on signal $T_{on}$ due to drifting of the feedback signal about the command signal. If toggling of the on-off control signal is not desired, an one-shot logic circuit can be used to implement logic circuit 24 so that for each assertion of the start laser signal, current source 26 is turned on only once.

In the present embodiment, current source 26 provides a predetermined boost current $I_{start}$. In other embodiments, current source 26 can be a programmable current source so that the magnitude of boost current $I_{start}$ can be adjusted and a desired amount of boost current can be selected depending on the turn-on time requirement and the capacitance of the compensation capacitor. Furthermore, in the present embodiment, timer 28 is provided with a preselected time duration. In other embodiments, timer 28 can be a programmable timer where the time duration is programmable to optimize the turn-on acceleration operation. By providing programmable features in the turn-on accelerator circuit of the present invention, the component values of the APC loop can be optimized to have a desired narrow bandwidth in steady-state operation while the turn-on operation can be independently tailored to meet separate laser turn-on time criteria.

In other embodiments, the turn-on accelerator circuit can be provided with an adjustable boost current value and a fixed time duration in timer 28, or a fixed boost current value but an adjustable time duration in timer 28, or both the boost current and the time duration can be adjustable.

Figure 2:
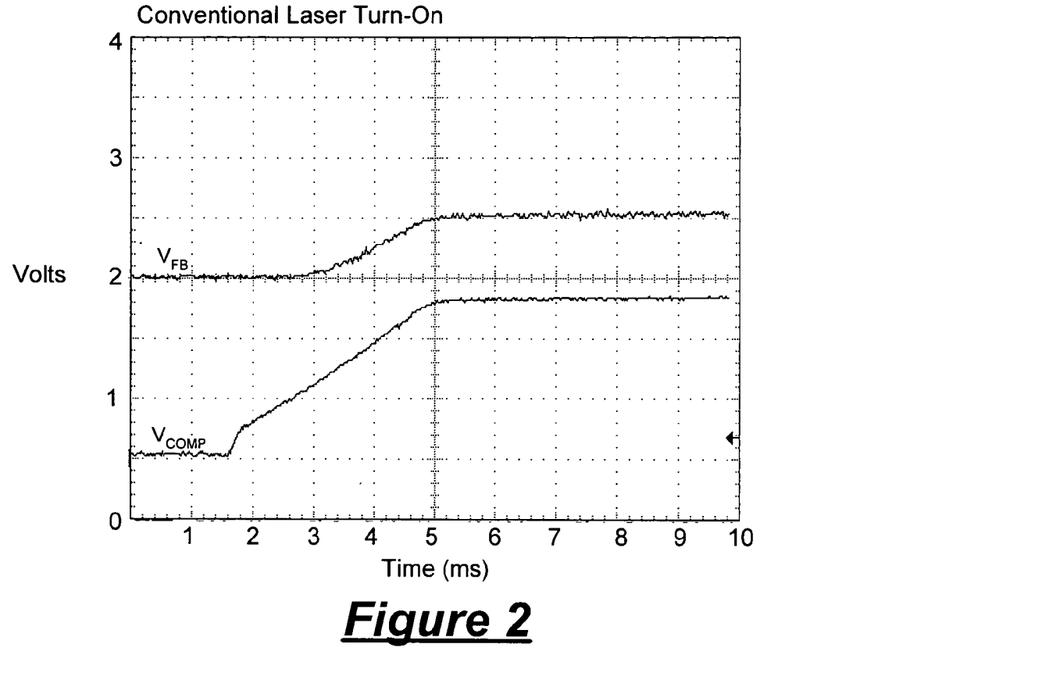
FIG. 2 are waveforms illustrating the turn-on operation of the laser diode system without using the laser turn-on accelerator circuit of the present invention.

FIG. 2 are waveforms illustrating the turn-on operation of the laser diode system without using the laser turn-on accelerator circuit of the present invention. The bottom curve illustrates the voltage $V_{COMP}$ on compensation capacitor $C_{COMP}$. The top curve illustrates the feedback voltage $V_{FB}$. In FIG. 2, it can be observed that when the laser diode system is turned on, the compensation capacitor is charged up by a fixed current until the voltage $V_{COMP}$ reaches a desired value. At the same time, feedback signal $V_{FB}$ which is indicative of the operational status of the laser diode increases until the feedback signal reaches the desired operating point, having a value equal to the command signal. In this case, the time that laser turn-on is initiated to the time that the feedback voltage $V_{FB}$ settles to a steady state value is almost 3.5 ms. The waveforms in FIG. 2 illustrate that for most applications, the APC loop by itself cannot turn the laser diode on fast enough to meet industrial standards.

Figure 3:
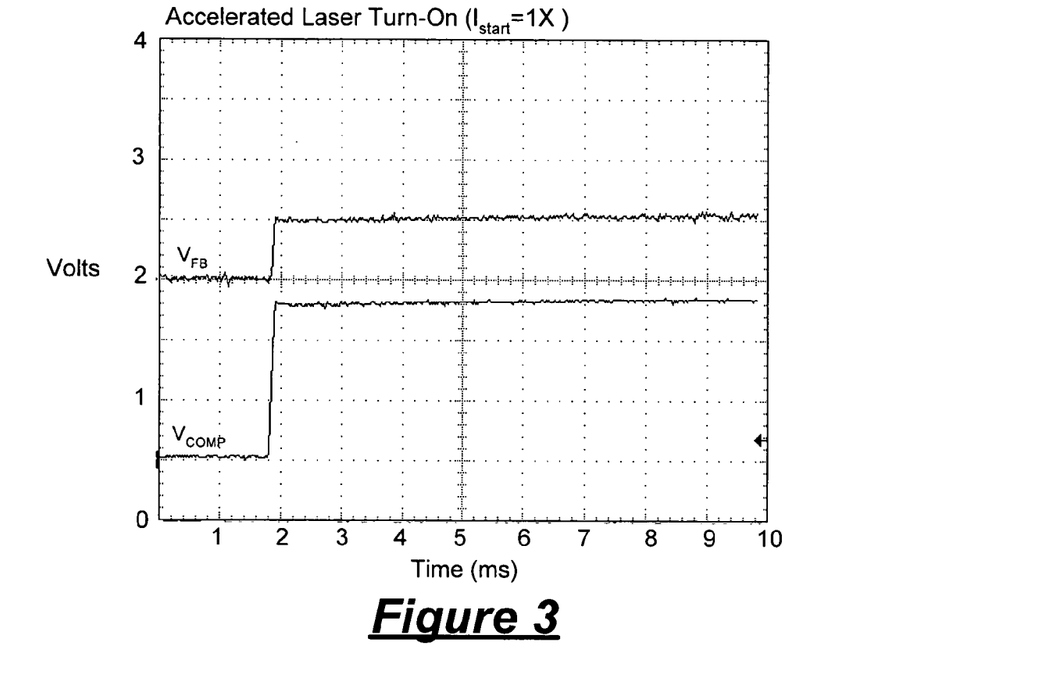
FIG. 3 are waveforms illustrating the turn-on operation of the laser diode system using the laser turn-on accelerator circuit of the present invention and a 1× $I_{start}$ current.

FIG. 3 are waveforms illustrating the turn-on operation of the laser diode system using the laser turn-on accelerator circuit of the present invention. In the present illustration, the boost current $I_{start}$ is assumed to have a 1× current value.

Figure 4:
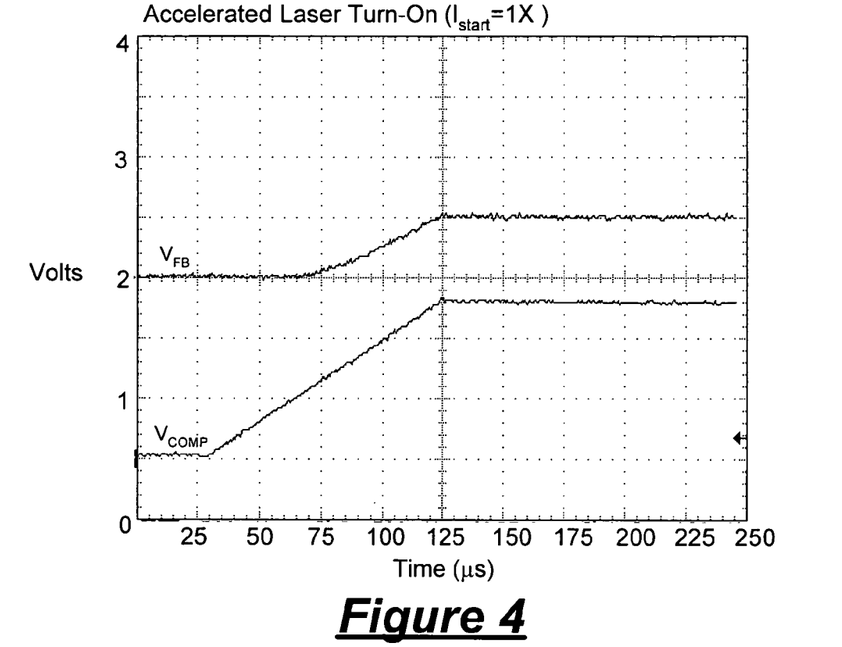
FIG. 4 is an expanded plot of the waveforms of FIG. 3 for illustrating the accelerated turn-on time.

FIG. 2 and FIG. 3 are plotted on the same scale to illustrate the turn-on acceleration provided by the laser turn-on accelerator circuit of the present invention. Specifically, the voltage $V_{COMP}$ increases rapidly to its steady state value and the feedback voltage $V_{FB}$ also increases rapidly to its steady state value. Thus, when the turn-on accelerator circuit of the present invention is used, the laser turned on almost instantaneously. FIG. 4 is an expanded plot of the waveforms of FIG. 3 for illustrating the accelerated turn-on time. In FIG. 4, the compensation capacitor $C_{COMP}$ is charged by a fixed magnitude boost current and the voltage $V_{COMP}$ increases linearly. In the present case, the laser turn-on time is about 100 µs, as opposed to the 3.5 ms (FIG. 2) required when no accelerator circuit is used.

Figure 5:
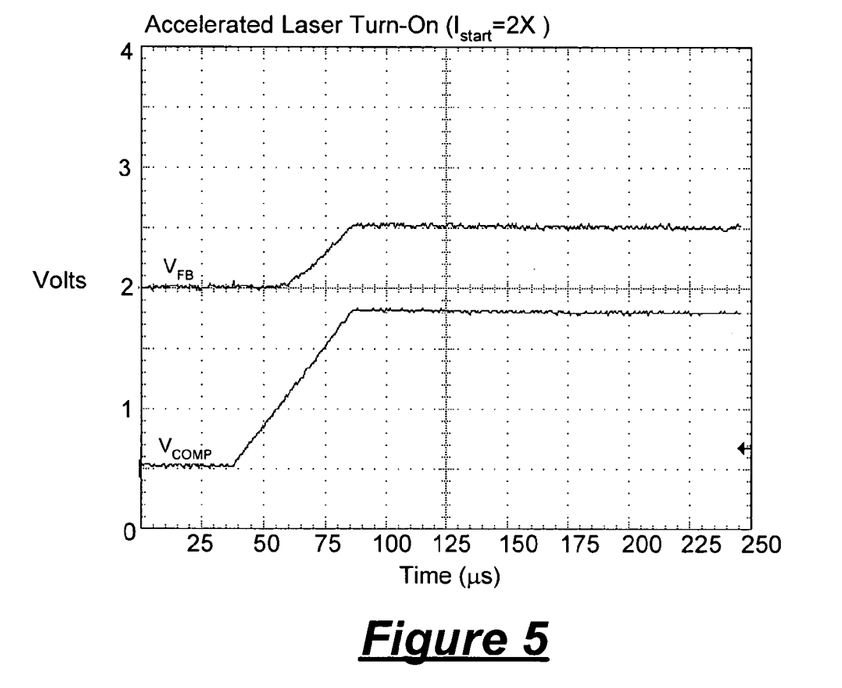
FIG. 5 are waveforms illustrating the turn-on operation of the laser diode system using the laser turn-on accelerator circuit of the present invention and a 2× $I_{start}$ current.

FIG. 5 are waveforms illustrating the turn-on operation of the laser diode system using the laser turn-on accelerator circuit of the present invention. In the present illustration, the boost current $I_{start}$ is assumed to have a 2× current value. As can be seen by a comparison of FIGS. 4 and 5, when twice the amount of boost current is used, the turn-on time is reduced by half to 50 µs.

Figure 6:
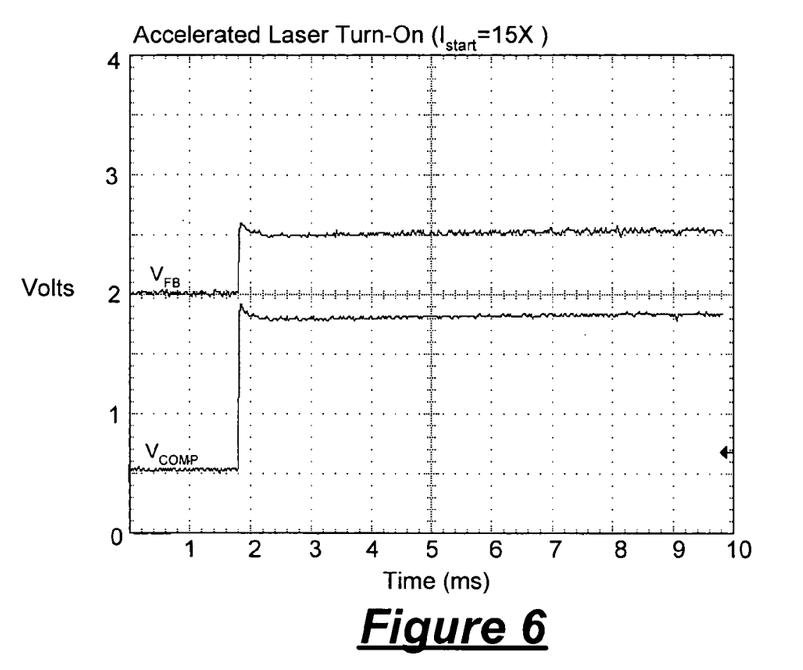
FIG. 6 are waveforms illustrating the turn-on operation of the laser diode system using the laser turn-on accelerator circuit of the present invention and a 15× Istart current.
Figure 7:
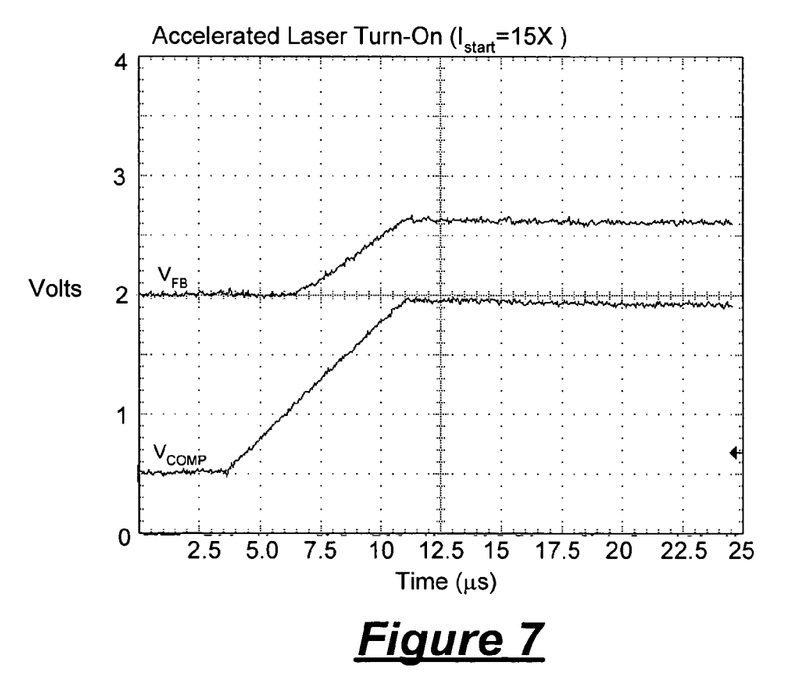
FIG. 7 is an expanded plot of the waveforms of FIG. 6 for illustrating the accelerated turn-on time.

FIG. 6 are waveforms illustrating the turn-on operation of the laser diode system using the laser turn-on accelerator circuit of the present invention. In the present illustration, the boost current $I_{start}$ is assumed to have a 15× current value. When a large boost current is used, the capacitor charges up very quickly and a small overshoot is observed on voltage $V_{COMP}$ and voltage $V_{FB}$. The overshoots is due to the delay through the comparator before the current source of the accelerator circuit can be turned-off. As described above, the overshoot can be alleviated by introducing systematic comparator offset. FIG. 7 is an expanded plot of the waveforms of FIG. 6 for illustrating the accelerated turn-on time. When a 15× boost current is used to charge capacitor $C_{COMP}$, the turn-on time is reduced to only 7.5 µs.

In the embodiment shown in FIG. 1, the turn-on accelerator circuit employs a close loop control for turn-on acceleration. That is, the accelerator circuit monitors the bias current level and the boost current is provided as long as the laser diode requires additional bias current to reach the desired operating point. The boost current is terminated when the desired operating point is reached. In other embodiments, the laser turn-on accelerator circuit can employ an open loop control whereby the turn-on acceleration is optimized by the adjusting the magnitude of the boost current and the duration of the time period the current is applied.

Figure 8:
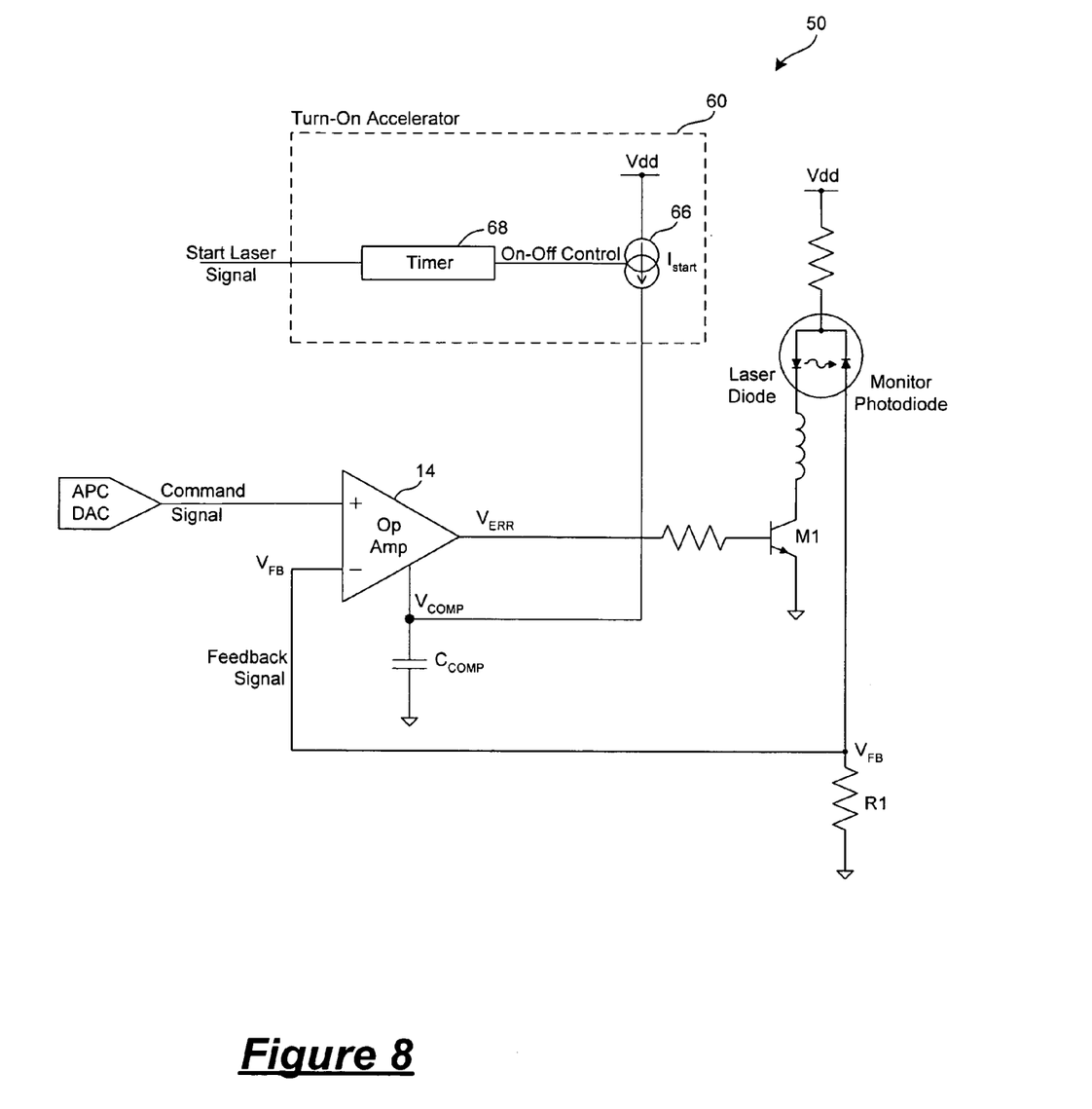
FIG. 8 is a schematic diagram of a laser diode system and illustrates the incorporation of a turn-on accelerator circuit in the laser diode system according to an alternate embodiment of the present invention.

FIG. 8 is a schematic diagram of a laser diode system and illustrates the incorporation of a turn-on accelerator circuit in the laser diode system according to an alternate embodiment of the present invention. Like elements in FIGS. 1 and 8 are given like reference numerals and will not be further described. Referring to FIG. 8, a turn-on accelerator circuit 60 is incorporated in the APC control loop of laser diode system 50 for providing a source of boost current to charge compensation capacitor $C_{COMP}$. In the present embodiment, turn-on accelerator 60 includes a timer 68 receiving a start laser signal as the input signal and a current source 66 controlled by timer 68. When the start laser signal, provided by a host system, is asserted, timer 68 asserts its output signal, which is the on-off control signal for current source 66, to turn on current source 66. Boost current $I_{start}$ is then provided to charge compensation capacitor $C_{COMP}$. After the preselected time duration programmed in timer 68 has expired, timer 68 deasserts its output signal to turn off current source 66.

Basically, when an open loop control is used, turn-on accelerator circuit 60, upon being triggered by the start laser signal, will provide boost current $I_{start}$ to compensation capacitor $C_{COMP}$ for a preselected time duration provided by timer 68. In the present embodiment, a fixed boost current and a fixed time duration are used in turn-on accelerator circuit 60. In an alternate embodiment, the magnitude of the boost current can be adjusted while the time duration is fixed. That is, the magnitude of the boost current can be programmable. In yet another alternate embodiment, the magnitude of the boost current can be fixed while the time duration is adjustable. That is, the time duration given by timer 68 can be programmable. In yet another embodiment, both the current value and the time duration can be adjustable to provide the desired operating condition for the turn-on accelerator circuit.

Finally, in another embodiment, boost current $I_{start}$ can be a pulse-width-modulated current with a fixed or adjustable duty-cycle. The pulse-width-modulated current can be provided to the compensation capacitor for a fixed or adjustable period of time. That is, the duty-cycle of the current source can be programmable and/or the time duration of the timer can be programmable. The pulse-width-modulated current source can be implemented in all of the other embodiments of the present invention, including the embodiments shown in FIGS. 1, 8 and 9.

Programmable current sources and programmable timers are well known in the art and various implementations are possible. In one embodiment, registers can be used to program the desired current magnitude or the desired time duration. In one embodiment, a programmable current source can be implemented by using an array of current sources with equal or varying current values. Control bits stored in an array of registers are used to turn on a selected number of current sources to obtain the desired boost current value.

When open loop control is used in the laser turn-on accelerator circuit of the present invention, the boost current magnitude and the time duration in which the current is applied should be selected so that sufficient charge is put on the compensation capacitor. If the turn-on accelerator circuit provides insufficient current (current magnitude too small or time duration too short), the turn-on control loop may fall short of reaching the desired operating point before being terminated. Thus, the laser diode has to wait for additional turn-on time for the APC control loop to work to bring up the bias current to the final steady state value. On the other hand, if the turn-on accelerator circuit provides too much current (current magnitude too large or time duration too long), the turn-on control loop may overshot the desired operating point and additional time is then required for the laser diode to settle back into the desired operating point. In most cases, providing too much charge is undesirable as it can also result in momentarily unsafe emission levels as well as accelerated laser aging or possibly even damage to the laser diode.

In another embodiment, the laser turn-on accelerator circuit has a programmable on-off function. Thus, a laser diode system incorporating the turn-on accelerator circuit can selectively enable or disable the accelerator circuit depending on the application. For example, transmitters or transceivers for telecommunications (e.g., SONET/SDH) applications call for narrower loop bandwidths but do not require fast laser turn-on. The laser diode system can be used for these applications by disabling the accelerator circuit. On the other hand, transmitters or transceivers for networking and storage applications (e.g., FC or GE) require fast laser turn-on. Thus, the same laser diode system can be used for these applications by enabling the accelerator circuit.

Figure 9:
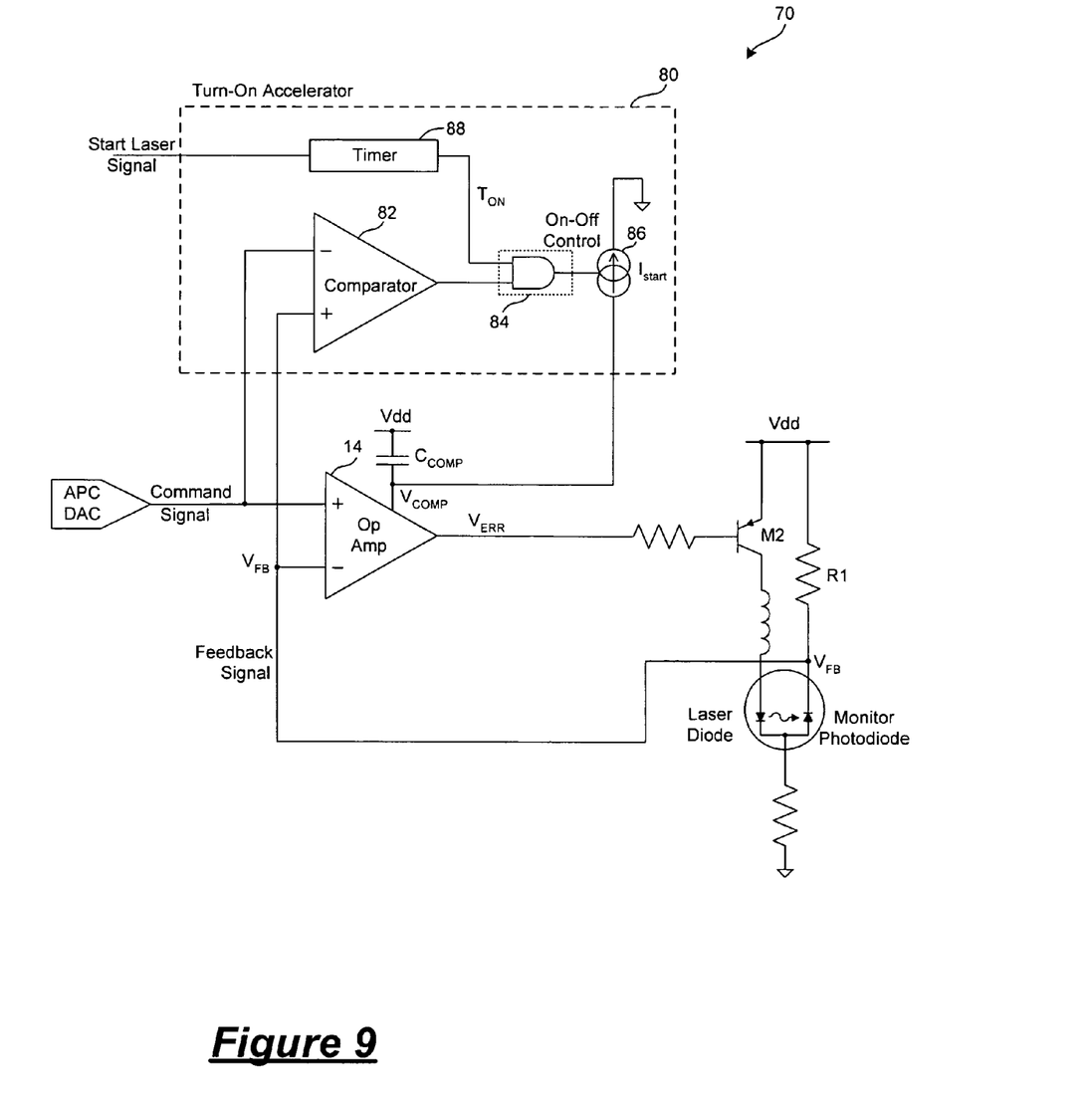
FIG. 9 is a schematic diagram of a laser diode system incorporating a laser turn-on accelerator circuit according to another embodiment of the present invention.

In the laser diode system of FIG. 1, the laser diode is shown as being configured in a first polarity where the anode of the laser diode is coupled to the Vdd power supply and the source of bias current is provided by an NPN bipolar transistor. It is well known that the laser diode can be configured in a second polarity as well where the cathode of the laser diode is coupled to the Vss or ground terminal. The laser turn-on accelerator circuit of the present invention can be applied to laser diode systems configured in any polarities. Of course, in the case of a laser diode configured in a second polarity, the current source of the turn-on accelerator circuit operates to provide a sinking current to pull charge out of the compensation capacitor instead of putting charge onto the compensation capacitor. FIG. 9 is a schematic diagram of a laser diode system incorporating a laser turn-on accelerator circuit according to one embodiment of the present invention. FIG. 9 illustrates the incorporation of the laser turn-on accelerator circuit in a laser diode system where the laser diode is configured in a second polarity, opposite to the polarity of the laser diode configuration in FIG. 1.

Referring to FIG. 9, a laser diode has its cathode terminal coupled through a resistor to the Vss terminal. A PNP bipolar transistor M2 provides a source of bias current to the laser diode. Transistor M2 is controlled by an operational amplifier 14 receiving a feedback signal $V_{FB}$ from a monitor photodiode and forming a APC loop for controlling the bias current provided to the laser diode. In the present implementation, the compensation capacitor $C_{COMP}$ is coupled between Vdd and a node in the operational amplifier.

In the present embodiment, laser turn-on accelerator circuit 80 includes a comparator 82 comparing the feedback signal and the command signal. The feedback signal is coupled to the positive input terminal of the comparator and the command signal is coupled to the negative input terminal of the comparator. Thus, in the present configuration, the feedback signal has a value that is greater than the command signal to indicate that the laser diode has not reached the commanded power and the feedback signal has a value that is equal to or less than the command signal to indicate that the laser diode has reached or exceeded the commanded power.

Laser turn-on accelerator circuit 80 also includes a timer 88 triggered by a start laser signal to provide a preselected time duration which sets the maximum allowable time for applying the boost current. The output signals from comparator 82 and timer 88 are coupled to a logic circuit 84 for providing an on-off control signal to a current source 86. In the present embodiment, current source 86 is coupled to the voltage $V_{COMP}$ node of compensation capacitor $C_{COMP}$ for sinking current out of the compensation capacitor to the Vss terminal. Logic circuit 84 is implemented as an AND gate in the present embodiment. In other embodiments, logic circuit 84 can be implemented as an one-shot circuit or other logical circuit providing the required functions as described above.

The operation of laser turn-on accelerator circuit 80 is the same as circuit 20 of FIG. 1. When the start laser signal is asserted and the command signal is provided to the APC control loop, timer 88 is activated and comparator 82 also asserts its output signal so that current source 86 is turned on to sink current out of compensation capacitor $C_{COMP}$. When comparator 82 detects that the feedback signal has reached its desirable operating point, comparator 82 will deassert its output and current source 86 is turned off. In any event, at the expiration of the preselected time duration programmed in timer 88, timer 88 will deassert its output to turn off current source 86. Timer 88 also operates to disable accelerator circuit 80 after the laser turn on operation is completed.

In the embodiments described above with reference to FIGS. 1 and 9, close loop control of the laser turn-on acceleration is provided through the use of a comparator monitoring the feedback signal and the command signal while a timer circuit is included to set the maximum allowable time the boost current $I_{start}$ can be applied to accelerate the turn-on operation of the laser turn. In the embodiments shown in FIGS. 1 and 9, the timer circuit functions as a safety switch to disable the boost current after certain maximum allowable time, regardless of whether the power level of the laser diode has reached the commanded power level. Furthermore, depending on the implementation of the logic circuit for generating the on-off control signal for the current source, the tinier circuit also functions to ensure that the turn-on accelerator circuit is disabled after the prescribed time period from the start laser signal so that drifting of the feedback signal would not cause the $I_{start}$ current source to turn back on by the comparator of the turn-on accelerator circuit. This is particularly important when an one-shot logic circuit is not used to implement the logic circuit for generating the on-off control signal. For example, when an AND gate or a NAND gate is used to implement the logo circuit, drifting of the feedback signal after laser turn-on can cause jittering of the on-off control signal.

However, in other embodiments, the timer circuit is optional and may be omitted from the laser turn-on accelerator circuit of the present invention. In particular, when the logic circuit is implemented as an one-shot logic circuit, the laser turn-on accelerator circuit of the present invention can be implemented without a timer circuit as the one-shot logic circuit will operate to ensure that the $I_{start}$ current source is turned on only once by the comparator for each assertion of the start laser signal. By using an one-shot logic circuit receiving the start laser signal as one of the input signals, jittering of the on-off control signal is avoided.

Figure 10:
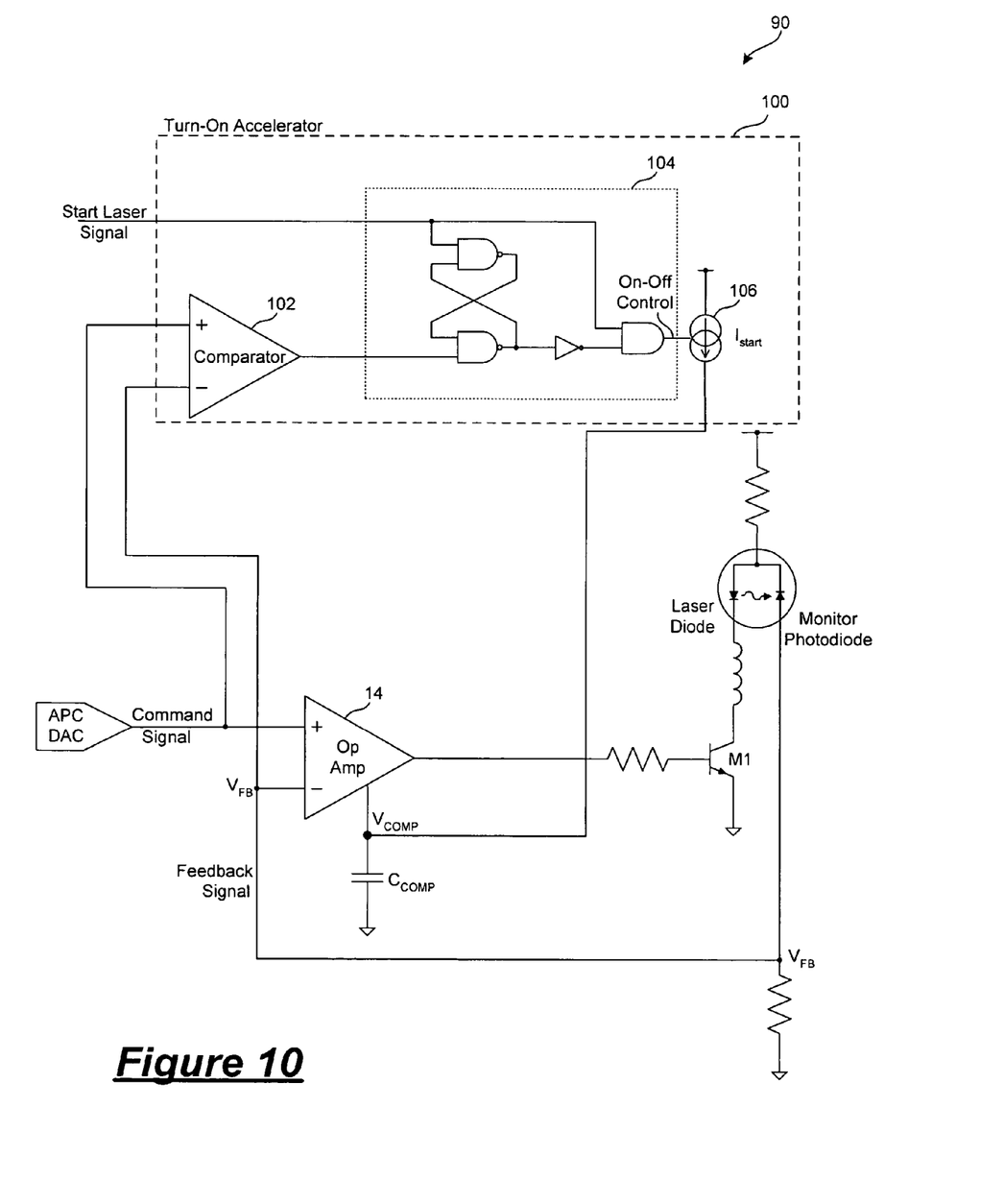
FIG. 10 is a schematic diagram of a laser diode system incorporating a laser turn-on accelerator circuit according to an alternate embodiment of the present invention.

FIG. 10 is a schematic diagram of a laser diode system incorporating a laser turn-on accelerator circuit according to an alternate embodiment of the present invention. Referring to FIG. 10, a laser turn-on accelerator circuit 100 is incorporated in a laser diode system 90. Laser turn-on accelerator circuit 100 includes a comparator 102 for providing close loop control for the turn-on acceleration operation. In the present embodiment, turn-on accelerator circuit 100 includes a one-shot logic circuit 104 for generating the on-off control signal to current source 106. Current source 106 provides a source of boost current $I_{start}$ to compensation capacitor $C_{COMP}$ during the turn-on operation of the laser diode to accelerate the turn-on operation.

In the present embodiment, one-shot logic circuit 104 is implemented as a reset-set flip-flop (R/S FF). The R/S flip-flop receives the start laser signal and the comparator output signal as input signals. The R/S flip-flop operates to assert the on-off control signal only once for each assertion of the start laser signal. In this manner, once the laser diode is turned on, should the diode power drops below the desired operating point and comparator 102 switches states, the one-shot logic circuit 104 will operate to prevent current source 106 from being turned back on and instead will allow the APC loop of the laser diode system to adjust the laser power level. In operation, current source 106 cannot be turned back on by comparator 102 until the start laser signal has been deasserted and reasserted again. In this manner, laser turn-on accelerator circuit 100 realizes close loop turn-on control and operates to turn on current source 106 only once for each assertion of the start laser signal.

Figure 11:
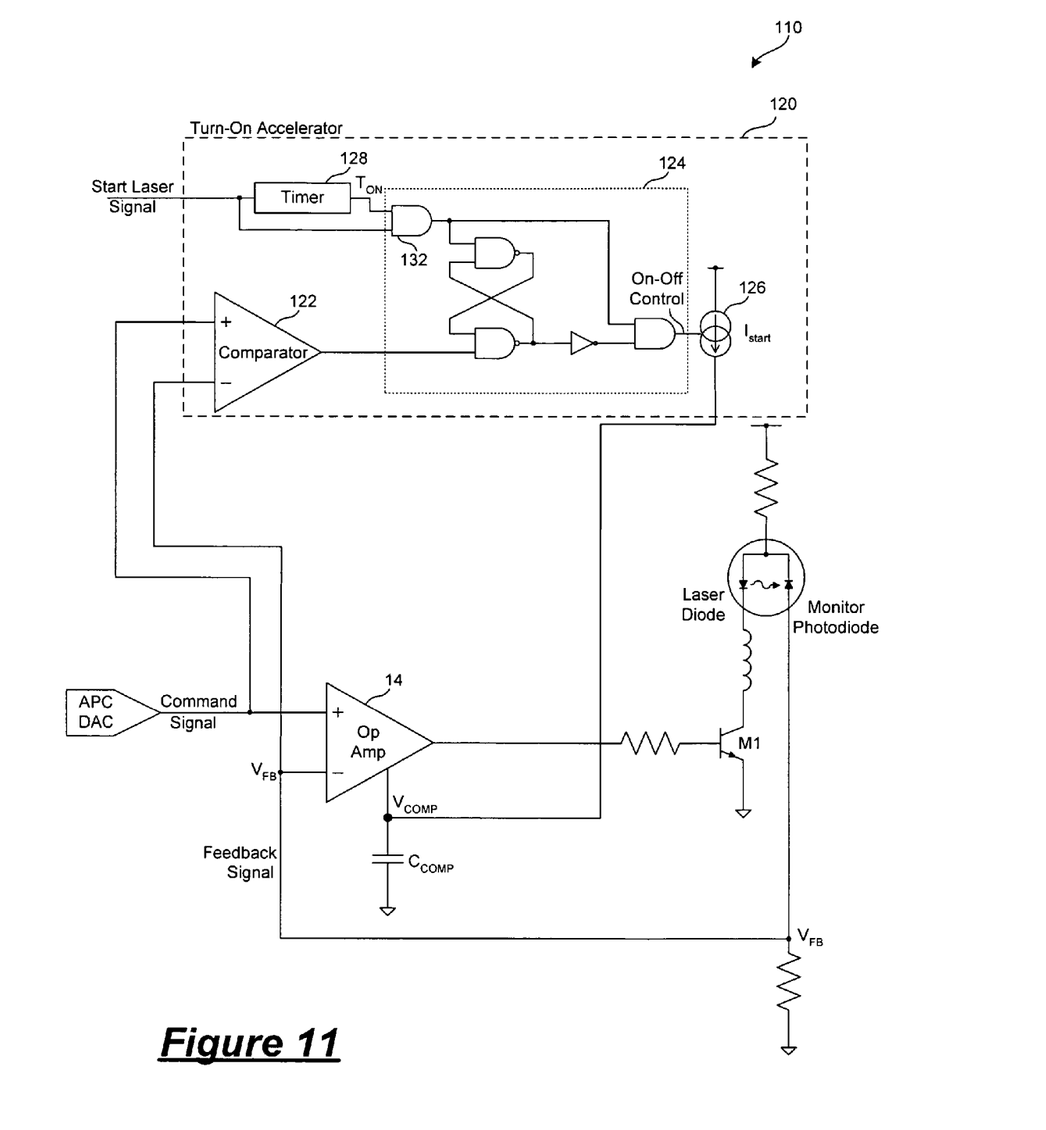
FIG. 11 is a schematic diagram of a laser diode system incorporating a laser turn-on accelerator circuit according to another embodiment of the present invention.

In other embodiments, a timer circuit can be included even when an one-shot logic circuit is used in the laser turn-on accelerator circuit. In this case, the timer circuit functions as a safety switch for disabling the turn-on accelerator circuit after certain maximum allowable time period. FIG. 11 is a schematic diagram of a laser diode system incorporating a laser turn-on accelerator circuit according to another embodiment of the present invention. Referring to FIG. 11, a laser turn-on accelerator circuit 120 is incorporated in a laser diode system 110. Laser turn-on accelerator circuit 120 includes a comparator 122 for providing close loop control for the turn-on acceleration operation. Laser turn-on accelerator circuit 120 also includes a timer circuit 128 for providing a preselected time duration for enabling the turn-on accelerator circuit. In the present embodiment, turn-on accelerator circuit 120 includes a one-shot logic circuit 124 for generating the on-off control signal to current source 126. Current source 126 provides a source of boost current $I_{start}$ to compensation capacitor $C_{COMP}$ during the turn-on operation of the laser diode to accelerate the turn-on operation.

In the present embodiment, one-shot logic circuit 124 is implemented as a reset-set flip-flop (R/S FF). The R/S flip-flop receives the start laser signal, the time-on signal $T_{on}$, and the comparator output signal as input signals. In the present embodiment, one-shot logic circuit 124 includes an AND gate 132 performing a logical AND operation on the start laser signal and the time-on signal $T_{on}$ from timer circuit 128. The AND'ed signal is coupled to the R/S FF of the one-shot logic circuit. The R/S flip-flop of one-shot logic circuit 124 operates in the same manner as logic circuit 104 described above to assert the on-off control signal only once for each assertion of the start laser signal. In this manner, once the laser diode is turned on, should the diode power drops below the desired operating point and comparator 122 switches states, the one-shot logic circuit 124 will operate to prevent current source 126 from being turned back on and instead will allow the APC loop of the laser diode system to adjust the laser power level, even if the preselected time duration provided by timer 108 has not expired. Furthermore, when the preselected time duration prescribed by timer circuit 128 expires, one-shot logic circuit 124 will deassert the on-off control signal to turn off the current source, regardless of the state of the comparator output signal.

In one embodiment, a laser diode system can be provided with two sets of current sources to accommodate multiple circuit topologies/polarities that may be used to implement the laser diode system. The comparator of the accelerator circuit are also programmable so that the same accelerator circuit can be used to accommodate different bias circuit topologies and laser types.

The above detailed descriptions are provided to illustrate specific embodiments of the present invention and are not intended to be limiting. Numerous modifications and variations within the scope of the present invention are possible. For example, the APC loop of the laser diode system described above is illustrative only. The laser turn-on accelerator circuit can be implemented in any laser diode system topologies as long as the proper boost current polarities is used. Furthermore, the signal polarities, that is the logical high or logical low values, used in the laser turn-on accelerator circuits in the above descriptions are illustrative only and one of ordinary skill in the art would appreciate that the reverse signal polarities can be used as long as all the control signals are properly inverted. That is, the current source can be turned on by a logical low control signal as opposed to a logical high control signal. The timer can be an active low signal having a logical low value when asserted and a logical high value when deasserted. The logic circuit for generating the on-off control signal can be configured accordingly to generate an on-off control signal for the current source having the desired signal polarity.

The above descriptions illustrate implementations of the logic circuit as an AND gate and as a one-shot logic circuit such as a reset-set flip-flop. The above description is illustrative only and is not intended to be limiting. One of ordinary skill in the art will appreciate that the logic circuit can be configured as any combination of logic gates and circuitry to provide the logic operation as described above. For instance, AND gate can be replaced by an NAND gate or other equivalent logic gates to implement the on-off control of the current source. Also, comparator 82 can be an inverting comparator providing an active low signal when the feedback signal and the command signal are different and an active high signal when the two signals are the same. The present invention is defined by the appended claims.

We claim:

1. An accelerator circuit for accelerating the turn-on operation of a laser diode, the laser diode being connected to a current driver circuit providing a bias current to the laser diode, a control circuit being connected to the current driver circuit for controlling the bias current in response to a command signal indicative of the desired bias current level and the commanded power of the laser diode and a feedback signal indicative of the laser output power level, the control circuit including a compensation capacitor establishing the control loop bandwidth of the control circuit, the accelerator circuit comprising:
   a comparator coupled to receive the command signal and the feedback signal, the comparator providing a first output signal having a first state when the feedback signal indicates that the laser diode has not reached the commanded power and having a second state when the feedback signal indicates that the laser diode has reached or exceeded the commanded power;
   a timer circuit coupled to receive a first signal for turning on the laser diode, the timer circuit providing a second output signal having a first state for a preselected time duration when triggered by the first signal and having a second state at the expiration of the preselected time duration;
   a first logic circuit coupled to receive the first output signal and the second output signal, the first logic circuit generating a control signal responsive to the first output signal and the second output signal; and
   a current source, responsive to the control signal, for providing a boost current to the compensation capacitor of the control circuit;
   wherein the first logic circuit provides the control signal having a first state operating to turn on the current source when the first output signal and the second output signal are in their respective first state, and the first logic circuit provides the control signal having a second state operating to turn off the current source when either the first output signal or the second output signal is in its respective second state.

2. The circuit of claim 1, wherein the first signal comprises a start laser signal provided by a host system instructing the laser driver circuit to turn on the laser diode.

3. The circuit of claim 1, wherein the timer circuit comprises a programmable timer providing a programmable time duration.

4. The circuit of claim 1, wherein the current source comprises a programmable current source providing a programmable value of boost current.

5. The circuit of claim 1, wherein the current source comprises a pulse-width-modulated current source providing a boost current having a first duty cycle.

6. The circuit of claim 5, wherein the pulse-width-modulated current source provides a boost current with a programmable duty cycle.

7. The circuit of claim 1, wherein the first logic circuit comprises an AND logic gate.

8. The circuit of claim 1, wherein the first logic circuit comprises an one-shot logic circuit.

9. The circuit of claim 8, wherein the first logic circuit comprises a reset-set flip-flop.

10. A laser driver circuit for driving a laser diode, comprising:
    a current-to-voltage converter for converting an output current of a photodiode into a feedback voltage, the photodiode monitoring the output power of the laser diode;
    a differential amplifier coupled to receive the feedback voltage and a command signal indicative of a predetermined bias current level for driving the laser diode to a commanded power level, the differential amplifier providing an output signal indicative of the difference between the feedback signal and the command signal, the differential amplifier including a compensation capacitor for determining a control loop bandwidth of the laser driver circuit;
    a current driver circuit providing a bias current to the laser diode corresponding to the output signal from the differential amplifier; and
    a turn-on accelerator circuit comprising:
        a comparator coupled to receive the command signal and the feedback signal, the comparator providing a first output signal having a first state when the feedback signal indicates that the laser diode has not reached the commanded power and having a second state when the feedback signal indicates that the laser diode has reached or exceeded the commanded power;
        a timer circuit coupled to receive a first signal for turning on the laser diode, the timer circuit providing a second output signal having a first state for a preselected time duration when triggered by the first signal and having a second state at the expiration of the preselected time duration;
        a first logic circuit coupled to receive the first output signal and the second output signal, the first logic circuit generating a control signal responsive to the first output signal and the second output signal; and
        a current source, responsive to the control signal, for providing a boost current to the compensation capacitor of the differential amplifier;
    wherein the first logic circuit provides the control signal having a first state operating to turn on the current source when the first output signal and the second output signal are in their respective first state, and the first logic circuit provides the control signal having a second state operating to turn off the current source when either the first output signal or the second output signal is in its respective second state.

11. The circuit of claim 10, wherein the first signal comprises a start laser signal provided by a host system instructing the laser driver circuit to turn on the laser diode.

12. The circuit of claim 10, wherein the first logic circuit comprises an AND logic gate.

13. The circuit of claim 10, wherein the first logic circuit comprises an one-shot logic circuit.

14. The circuit of claim 13 wherein the first logic circuit comprises a reset-set flip-flop.

15. A method for turning on a laser diode, the laser diode being controlled by a control loop including a compensation capacitor for establishing the bandwidth of the control loop, the method comprising:
   receiving a first signal for turning on the laser diode;
   generating a second signal having a first state for a predetermined time duration when triggered by the first signal and having a second state at the expiration of the predetermined time duration;
   receiving a command signal indicative of a predetermined bias current level for driving the laser diode to a commanded power level;
   receiving a feedback signal indicative of the laser output power level;
   comparing the feedback signal to the command signal;
   generating a third signal having a first state when the feedback signal indicates that the laser diode has not reached the commanded power and having a second state when the feedback signal indicates that the laser diode has reached or exceeded the commanded power;
   generating a control signal responsive to the second signal and the third signal, the control signal having a first state when the second signal and the third signal are in their respective first state, and the control signal having a second state when either the second signal or the third signal is in its respective second state;
   providing a current to the compensation capacitor when the control signal is in the first state; and
   terminating the current to the compensation capacitor when the control signal is in the second state.

16. The method of claim 15, wherein generating a control signal responsive to the second signal and the third signal comprises:
   performing a logical "AND" operation on the second signal and the third signal to generate the control signal.

17. An accelerator circuit for accelerating the turn-on operation of a laser diode, the laser diode being connected to a current driver circuit providing a bias current to the laser diode, a control circuit being connected to the current driver circuit for controlling the bias current in response to a command signal indicative of the desired bias current level and the commanded power of the laser diode and a feedback signal indicative of the laser output power level, the control circuit including a compensation capacitor establishing the control loop bandwidth of the control circuit, the accelerator circuit comprising:
   a laser turn-on control circuit coupled to receive a first signal for turning on the laser diode when the laser diode has been turned off, the laser turn-on control circuit providing a control signal having a first state indicative of a first condition for turning on the laser diode and a second state indicative of a second condition; and
   a current source, responsive to the control signal, for providing a boost current to the compensation capacitor of the control circuit,
   wherein the laser turn-on control circuit provides the control signal having the first state for turning on the current source, and the laser turn-on control circuit provides the control signal having the second state for turning off the current source and wherein the laser turn-on control circuit comprises:
   a comparator coupled to receive the command signal and the feedback signal, the comparator providing a first output signal having a first state when the feedback signal indicates that the laser diode has not reached the commanded power and having a second state when the feedback signal indicates that the laser diode has reached or exceeded the commanded power;
   a timer circuit coupled to receive the first signal for turning on the laser diode, the timer circuit providing a second output signal having a first state for a preselected time duration when triggered by the first signal and having a second state at the expiration of the preselected time duration; and
   a first logic circuit coupled to receive the first output signal and the second output signal, the first logic circuit generating the control signal responsive to the first output signal and the second output signal,
   wherein the first logic circuit provides the control signal having the first state operating to turn on the current source when the first output signal and the second output signal are in their respective first state, and the first logic circuit provides the control signal having the second state operating to turn off the current source when either the first output signal or the second output signal is in its respective second state.

18. A laser driver circuit for driving a laser diode, comprising:
   a current-to-voltage converter for converting an output current of a photodiode into a feedback voltage, the photodiode monitoring the output power of the laser diode;
   a differential amplifier coupled to receive the feedback voltage and a command signal indicative of a predetermined bias current level for driving the laser diode to a commanded power level, the differential amplifier providing an output signal indicative of the difference between the feedback signal and the command signal, the differential amplifier including a compensation capacitor for determining a control loop bandwidth of the laser driver circuit;
   a current driver circuit providing a bias current to the laser diode corresponding to the output signal from the differential amplifier; and
   a turn-on accelerator circuit comprising:
      a laser turn-on control circuit coupled to receive a first signal for turning on the laser diode when the laser diode has been turned off, the laser turn-on control circuit providing a control signal having a first state indicative of a first condition for turning on the laser diode and a second state indicative of a second condition; and
      a current source, responsive to the control signal, for providing a boost current to the compensation capacitor of the differential amplifier,
   wherein the laser turn-on control circuit provides the control signal having the first state for turning on the current source, and the laser turn-on control circuit provides the control signal having the second state for turning off the current source, and wherein the laser turn-on control circuit comprises:

a comparator coupled to receive the command signal and the feedback signal, the comparator providing a first output signal having a first state when the feedback signal indicates that the laser diode has not reached the commanded power and having a second state when the feedback signal indicates that the laser diode has reached or exceeded the commanded power;

a timer circuit coupled to receive the first signal for turning on the laser diode, the timer circuit providing a second output signal having a first state for a preselected time duration when triggered by the first signal and having a second state at the expiration of the preselected time duration; and a first logic circuit coupled to receive the first output signal and the second output signal, the first logic circuit generating the control signal responsive to the first output signal and the second output signal, wherein the first logic circuit provides the control signal having the first state operating to turn on the current source when the first output signal and the second output signal are in their respective first state, and the first logic circuit provides the control signal having the second state operating to turn off the current source when either the first output signal or the second output signal is in its respective second state.

19. A method for turning on a laser diode, the laser diode being controlled by a control loop including a compensation capacitor for establishing the bandwidth of the control loop, the method comprising:

receiving a first signal having a first state for turning on the laser diode when the laser diode has been turned off and a second state for turning off the laser diode;

generating a control signal responsive to the first signal, the control signal having a first state indicative of a first condition for turning on the laser diode and a second state indicative of a second condition;

providing a current to the compensation capacitor when the control signal is in the first state; and terminating the current to the compensation capacitor when the control signal is in the second state;

generating a second signal having a first state for a predetermined time duration from the first signal having the first state and having a second state at the expiration of the predetermined time duration;

receiving a command signal indicative of a predetermined bias current level for driving the laser diode to a commanded power level;

receiving a feedback signal indicative of the laser output power level;

comparing the feedback signal to the command signal; and generating a third signal having a first state when the feedback signal indicates that the laser diode has not reached the commanded power and having a second state when the feedback signal indicates that the laser diode has reached or exceeded the commanded power, wherein generating the control signal comprises:

generating the control signal responsive to the second signal and the third signal, the control signal having the first state when the second signal and the third signal are in their respective first state, and the control signal having the second state when either the second signal or the third signal is in its respective second state.

* * * * *